(12) United States Patent
Choy et al.

(10) Patent No.: US 11,289,144 B1
(45) Date of Patent: Mar. 29, 2022

(54) NON-VOLATILE MEMORY WITH VIRTUAL GROUND VOLTAGE PROVIDED TO UNSELECTED COLUMN LINES DURING MEMORY WRITE OPERATION

(71) Applicant: NXP USA, Inc., Austin, TX (US)

(72) Inventors: Jon Scott Choy, Austin, TX (US); Karthik Ramanan, Austin, TX (US); Padmaraj Sanjeevarao, Austin, TX (US); Jacob T. Williams, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/032,537

(22) Filed: Sep. 25, 2020

(51) Int. Cl.
    *G11C 11/16* (2006.01)

(52) U.S. Cl.
    CPC ...... *G11C 11/1675* (2013.01); *G11C 11/1655* (2013.01); *G11C 11/1659* (2013.01); *G11C 11/1697* (2013.01)

(58) Field of Classification Search
    None
    See application file for complete search history.

(56) References Cited

U.S. PATENT DOCUMENTS

| | | | |
|---|---|---|---|
| 6,259,644 B1 | 7/2001 | Tran et al. | |
| 7,808,856 B2 | 10/2010 | Ehrenreich et al. | |
| 7,808,865 B2 | 10/2010 | Tsai et al. | |
| 8,432,727 B2 | 4/2013 | Ryu et al. | |
| 8,537,625 B2 | 9/2013 | Ramaraju et al. | |
| 9,196,342 B2 | 11/2015 | Alam et al. | |
| 9,368,224 B2 | 6/2016 | Wang et al. | |
| 9,390,798 B2 | 7/2016 | Sekar et al. | |
| 9,786,343 B1 | 10/2017 | DeBrosse | |
| 10,796,741 B1 | 10/2020 | Williams et al. | |
| 2007/0140029 A1 | 6/2007 | Kim et al. | |
| 2014/0347912 A1* | 11/2014 | Siau | G11C 13/004 365/148 |
| 2016/0379710 A1* | 12/2016 | Sekar | G11C 8/10 365/148 |
| 2017/0236581 A1 | 8/2017 | Yang et al. | |

OTHER PUBLICATIONS

U.S. Appl. No. 17/032,516, Ramanan, Karthik: "Non-Volatile Memory Having Virtual Ground Circuitry", filed Sep. 25, 2020.
U.S. Appl. No. 16/507,691, Ramanan, Karthik: "Reference Generation for Voltage Sensing in a Resistive Memory", filed Jul. 10, 2019.
U.S. Appl. No. 16/845,315, Sanjeevarao, Padmaraj: "Non-Volatile Memory With Multiplexer Transistor Regulator Circuit", filed Apr. 10, 2020.

* cited by examiner

*Primary Examiner* — J. H. Hur

(57) ABSTRACT

A non-volatile memory includes virtual ground circuitry configured to generate a virtual ground voltage at a virtual ground node, a memory array of memory cells in which each memory cell includes a select transistor and a storage element and is coupled to a first column line of a plurality of first column lines; and a first decoder configured to select a set of first column lines for a memory write operation to a selected set of the memory cells. The non-volatile memory also includes write circuitry configured to receive a write value for storage into the selected set of memory cells, and a first column line multiplexer configured to, during the memory write operation, couple each selected first column line of the set of first column lines to the write circuitry, and couple each unselected first column line of the plurality of first column lines to the virtual ground node.

23 Claims, 11 Drawing Sheets

NON-VOLATILE MEMORY WITH VIRTUAL GROUND VOLTAGE PROVIDED TO UNSELECTED COLUMN LINES DURING MEMORY WRITE OPERATION

CROSS-REFERENCE TO RELATED APPLICATION(S)

This application is related to U.S. patent application Ser. No. 17/032,516, filed on even date, entitled "Non-Volatile Memory Having Virtual Ground Circuitry," and assigned to the current assignee hereof.

BACKGROUND OF THE INVENTION

Field of the Invention

This invention relates to non-volatile memories, and more specifically, to non-volatile memories having virtual ground circuitry.

Background

Non-volatile memories are utilized for storing data in an electronic system including when the system is powered down. One type of non-volatile memory is a resistive memory, in which each bit cell of a resistive memory includes a resistive storage element which is in either a high resistive state (HRS) or a low resistive state (LRS), depending on the logic state of the bit cell. In some embodiments, for a write operation of a bit cell of a resistive memory, a write current is provided in a first direction through the resistive storage element to place it in the HRS, and a write current is provided in a second and opposite direction through the resistive storage element to place it in the LRS.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes an array of resistive memory cells and a virtual ground generator which provides a virtual ground voltage which is applied as a source bias voltage to a column line (e.g. source line or bit line) during a read operation. By using the virtual ground rather than true ground in this manner (in which the virtual ground is greater than the true ground, 0V), leakage current through the unselected cells can be reduced. In one embodiment, the memory array parasitic capacitance due to the unselected memory cells may provide stability to the virtual ground. In one embodiment, a current compensation technique is used along with the virtual ground to compensate for any charge that is being transferred to the virtual ground. This may allow the virtual ground to maintain its target level even after a plurality of consecutive reads.

As also disclosed herein, the virtual ground can be used during a write operation to reduce time-dependent gate oxide breakdown (TDDB) stresses within an NVM circuit, such as a resistive memory circuit. In one embodiment, during a write operation, all unselected source lines and all unselected bit lines are biased at the virtual ground level rather than true ground in an attempt to reduce TDDB stresses, thereby possibly extending the longevity of the NVM circuit.

Figure 1:
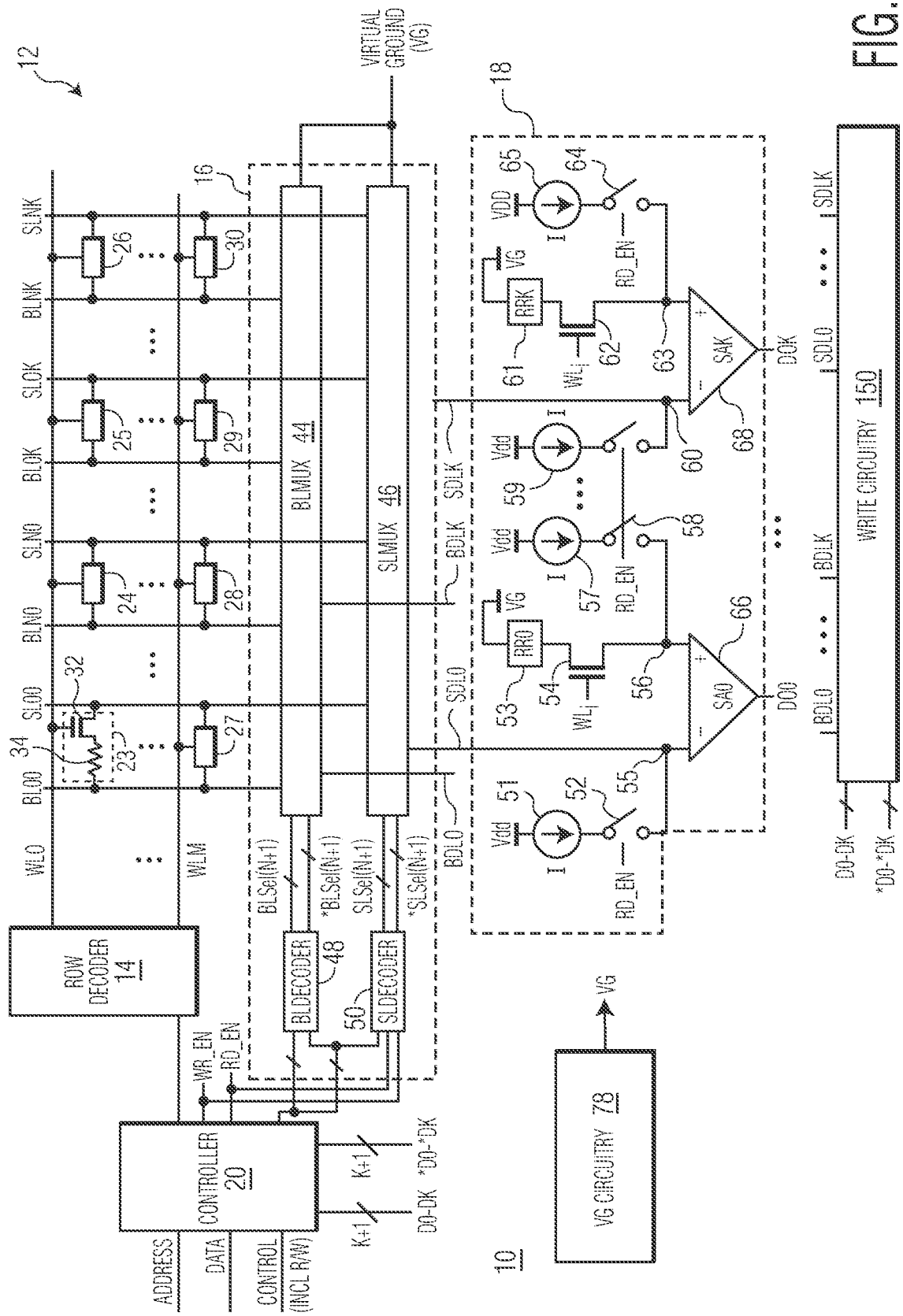
FIG. 1 is a circuit diagram of a non-volatile memory circuit according to one embodiment of the present invention.

FIG. 1 shows a circuit diagram of a non-volatile memory circuit 10 according to one embodiment of the present invention. Memory circuit 10 includes an array 12 of non-volatile memory cells (e.g. 23-30), a controller 20, a row decoder 14, column decoder 16, read circuitry 18, virtual ground (VG) circuitry 78, and write circuitry 150. In one embodiment, the memory cells of array 12 are characterized as resistive memory cells with a select transistor (e.g. 32) and a resistive storage element (e.g. 34). Types of resistive memory cells include, for example, MRAM, ReRAM, carbon nanotube, and phase change memory cells. In some embodiments, these resistive memory cells may be implemented by a magnetic tunnel junction (MTJ), therefore, each bit cell may be described as including a select transistor (e.g. 32) and an MTJ (e.g. 34). Note that in the illustrated embodiments, the select gate transistors are N-type metal-oxide-semiconductor (NMOS) transistors. However, other types of resistive memory cells may have other configurations and/or maybe implemented with other types of resistive storage structures. In some embodiments, memory circuit 10 may be coupled to a processor circuit (not shown) of an electronic system that provides data to be written in the memory and receives the read data from the memory. Memory 10 is also coupled to supply voltage terminals coupled to receive corresponding supply voltages, such as VDD and VSS, in which VDD is greater than VSS. In one embodiment, VSS is true ground or 0V. Note that as used herein, VDD and VSS may also refer to the voltage supply terminals which receive the corresponding supply voltages.

The memory cells of array 12 are arranged in rows and columns. Each cell of a row is coupled to a corresponding word line of WL0-WLM for controlling the select transistor (e.g. 32) of the cell to access the resistive storage element (e.g. 34) of the cell during a memory operation. The word lines are controlled by a row decoder 14 which asserts a selected one of the word lines based on a first portion of an address received by a controller 20 of memory circuit 10 for the memory operation. Array 12 includes M+1 number of rows with 2 rows being shown in FIG. 1. However, an array may include a different number of rows in other embodiments. For example, an 8 Mb memory array may have 2048 rows plus a few (e.g., 2 or 4) redundant rows.

In the embodiment shown, the cells of each column of array 12 are coupled to a corresponding source line of SL00-SLNK and a corresponding bit line of BL00-BLNK. Array 12 includes (N+1)*(K+1) source lines and (N+1)*(K+1) bit lines, in which FIG. 1 illustrates four source lines (e.g. SL00, SLN0, SL0K, and SLNK) and four bit lines (e.g. BL00, BLN0, BL0K, and BLNK). However, array 12 may have a different number of columns in other embodiments. (e.g. 64*(N+1)). In other embodiments, each column of an array may include a source line paired with two bit lines, a single bit line, or different combinations of bit lines and source lines. As described herein, a "column line" or "column" may refer to either a source line or a bit line. Array 12 may also include one or more columns of reference cells. In the illustrated embodiment, the select transistors of the reference cells are illustrated in the read circuitry, which is discussed further below. Each cell may include a reference resistor or each column may share a reference resistor.

In the embodiment shown, memory circuit 10 includes a column decoder 16 for selecting a subset of the bit lines and source lines (SL00-SLNK, BL00-BLNK) to provide as bit data lines (BDL0-BDLK) and source data lines (SDL0-SDLK). In the illustrated embodiment, both the bit data lines and the source data lines are provided to write circuitry 150, and the source data lines are provided to read circuitry 18. However, in alternate embodiments, the bit data lines rather than the source data lines can be provided to read circuitry 18. Column decoder 16 includes a bit line multiplexer 44 for selecting a subset of the bit lines (BL00-BLNK) and source line multiplexer 46 for selecting a subset of the source lines (SL00-SLNK) during a memory operation. The control inputs for bit line multiplexer 44 (including a bit line select bus, BLSel, and a complementary bit line select bus, *BLSel, each having N+1 bits) are provided by a bit line decoder 48. The control inputs for the source line multiplexer 46 (including a source line select bus, SLSel, and a complementary source line select bus, *SLSel, each having N+1 bits) are provided by source line decoder 50. The control signals from decoders 48 and 50 are based on a second portion of the ADDRESS received by controller 20, which provides the second address portion to decoders 48 and 50, as well as one or more of a write enable signal (WR_EN) and a read enable signal (RD_EN). Controller 20 may generate WR_EN and RD_EN using the read/write signal (R/W) received by controller 20 as part of the control signals for a memory access request.

Column decoder 16 selects K+1 number of selected bit lines and selected source lines from a total number of (K+1)*(N+1) bit lines and source lines of array 12 based on the second portion of the ADDRESS received by controller 20 for the memory operation. In some embodiments, K+1 represents the size of the data unit (e.g. 8, 16, 32, 64 bits) being written to or read from memory array 12 during a memory operation. In other embodiments, K+1 may include multiple data units (e.g. 128 bits, 256 bits) in a row. N+1 represents the decode ratio (e.g. 4 to 1, 8 to 1, 16 to 1) of column decoder 16. That is, referring to array 12, bit lines BL00-BLNK includes K+1 groups of N+1 bit lines each, such that the first number of the index refers to one of the N+1 bit lines within a particular group of the K+1 groups, and the second number of the index refers to one of the K+1 groups. For example, BL30 refers to bit line 3 in group 0, and BLNK refers to bit line N in group K. The same arrangement and nomenclature applies for source lines SL00-SLNK.

During a write operation, the selected source lines and the selected bit lines are coupled to write circuitry 150, which also receives write data via the data lines (D0-DK) and complementary data lines (*D0-*DK). Write circuitry 150, as will be discussed in reference to FIGS. 7 and 8, includes source line driver circuits and bit line driver circuits which receive the write data to be stored in a selected row of array 12. In one embodiment, during a write operation to a bit cell of a column, a bit line driver corresponding to the column couples the bit line (e.g. BL00) of the column to one write voltage of either VDD or VSS and a source line driver corresponding to the column couples the source line (e.g. SL00) of the column to the other write voltage of VDD or VSS, depending on the data value being written as determined by the data lines (D0-DK) and complementary data lines (*D0-*DK). During the write operation, the select transistor (e.g. 32) is made conductive by assertion of the appropriate word line to provide a voltage differential across the resistive storage element (e.g. 34) whose polarity determines whether a 1 or 0 is written to the cell.

In the embodiment shown, during a read operation, the selected source lines are provided to read circuitry 18 via mux transistors in SLMUX 46 and via the source data lines (SDL0-SDLK). Read circuitry 18 includes K+1 sense amplifiers SA0-SAK (e.g. 66 and 68), in which each sense amplifier provides a corresponding read bit value from the cell to an output data line (DO0-DOK).

Each sense amplifier (e.g. 66) of read circuitry 18 has an inverting input (−) coupled to a corresponding column data line (e.g. SDL0) from column decoder 16 as well as a corresponding current load device (e.g., 51) via an enable switch (e.g. 52), and a non-inverting input (+) coupled to a corresponding reference path (e.g. 53 and 54) as well as a corresponding load device via an enable switch (e.g. 58). For example, SAK has an inverting input coupled to SDLK and to a corresponding current load device 59 via an enable switch 58, and a non-inverting input (+) coupled to a corresponding reference path (e.g. 62 and 61) as well as a corresponding load device (e.g. 65) via an enable switch (e.g. 64). All enable switches are controlled by RD_EN such that they are closed (conductive) when RD_EN is asserted for a read operation and open (non-conductive) when RD_EN is negated (when a read operation is not occurring).

In one embodiment, each current load device (i.e. current source) can be implemented as a p-type metal-oxide-semiconductor (PMOS) transistor having a first current electrode coupled to a first voltage supply terminal, e.g., VDD, a control electrode coupled to receive a bias voltage, and a second current electrode coupled to the inverting or non-inverting input of the corresponding SA. In one embodiment, each SA is implemented as a comparator. In the illustrated embodiment, the selected column data lines from column decoder 16 coupled to the sense amplifiers refer to the selected source data lines (e.g. SDL0) from SLMUX 46. However, in alternate embodiments, the selected column data lines can refer to the selected bit data lines (e.g. BDL0) from BLMUX 44. Also, in alternate embodiments, the inverting and non-inverting inputs may be swapped.

Each reference path in read circuitry 18 includes a corresponding reference resistor (e.g. RR0 53) and a corresponding select transistor (e.g. 54). As stated above, in one embodiment, array 12 includes one or more columns of reference memory cells, in which each reference memory cell includes a corresponding select transistor used to enable the reference memory cell for a read operation. In one embodiment, each group of N+1 source lines has a corresponding column of reference memory cells. Alternatively, one column of reference memory cells may be used for all of array 12. When a word line is asserted for a read operation, the word line also enables the corresponding select transistor in the reference column (e.g. 54) which connects the corresponding reference resistor (e.g. RR0 53) to the non-inverting input of the corresponding sense amplifier. Therefore, in FIG. 1, the reference select transistors (e.g. 54) correspond to the selected reference select transistors of the reference memory cells in array 12, and WLi corresponds to the selected word line during a read operation such that the gate electrode of the reference select transistor (e.g. 54) receives the same voltage as the selected word line of array 12.

In the illustrated embodiment, each column of reference memory cells has a corresponding reference resistor (one of RR0 53-RRK 61) which may be located outside array 12. For example, for any row selected within a particular group of the K+1 groups, (e.g. K=0), a same reference resistor (e.g. RR0 53) is used for the reference path regardless of which source line is selected within the group. For example, for a selected cell in the group with K=3, RR3 is used in the reference path, regardless of which source line within group K=3 is selected. In an alternate embodiment, each reference memory cell in array 12, in addition to including the reference select transistor, may also include a reference resistor. Note that, in one embodiment, the reference resistors (also referred to as reference resistive elements which may include one or more resistors) each have a resistance set to a resistance value which is about half way between the resistance value of the HRS and the resistive value of the LRS. In one embodiment, the reference resistors are trimmable.

During a read operation, RD_EN is asserted, closing the enable switches (e.g. switches 52 and 58) such that a forced read current I is provided to the input nodes of the sense amplifier (e.g. at node 55 at the inverting input of SA0 and node 56 at the non-inverting input of SA0). The current on the source data line (e.g. SDL0) determines the voltage at the inverting input (e.g. voltage at node 55) and the current in the reference path determines the voltage at the non-inverting input (e.g. voltage at node 56). The sense amplifier compares the resulting voltages at it inputs and provides the output data bit (e.g. DO0) as a "1" if the voltage at the non-inverting input is greater than the voltage at the inverting input and a "0" otherwise.

Note that each sense amplifier is coupled to a corresponding source data line and reference path analogous to the description of SA0. For example, SAK has an inverting input coupled to SDLK and to a corresponding current load device 59 via an enable switch 58, and a non-inverting input (+) coupled to a corresponding reference path (e.g. 62 and 61) as well as a corresponding load device (e.g. 65) via an enable switch (e.g. 64).

Each of the reference paths in read circuitry 18 are coupled between an input of the sense amplifiers (the non-inverting inputs in the illustrated embodiment) and a virtual ground (VG) node. A VG voltage is supplied to VG node by VG circuitry 78. Embodiments of VG circuitry 78 are provided in reference to FIGS. 4 and 5 below. The reference voltage is selected such that the generated VG voltage is greater than true ground (e.g. 0V), and between VSS and VDD. In one embodiment, the VG voltage is at least 100 mV greater than VSS. Alternatively, the VG voltage is at least 150 mV greater than VSS. In this embodiment, the reference voltage is about 150 mV.

Figure 2:
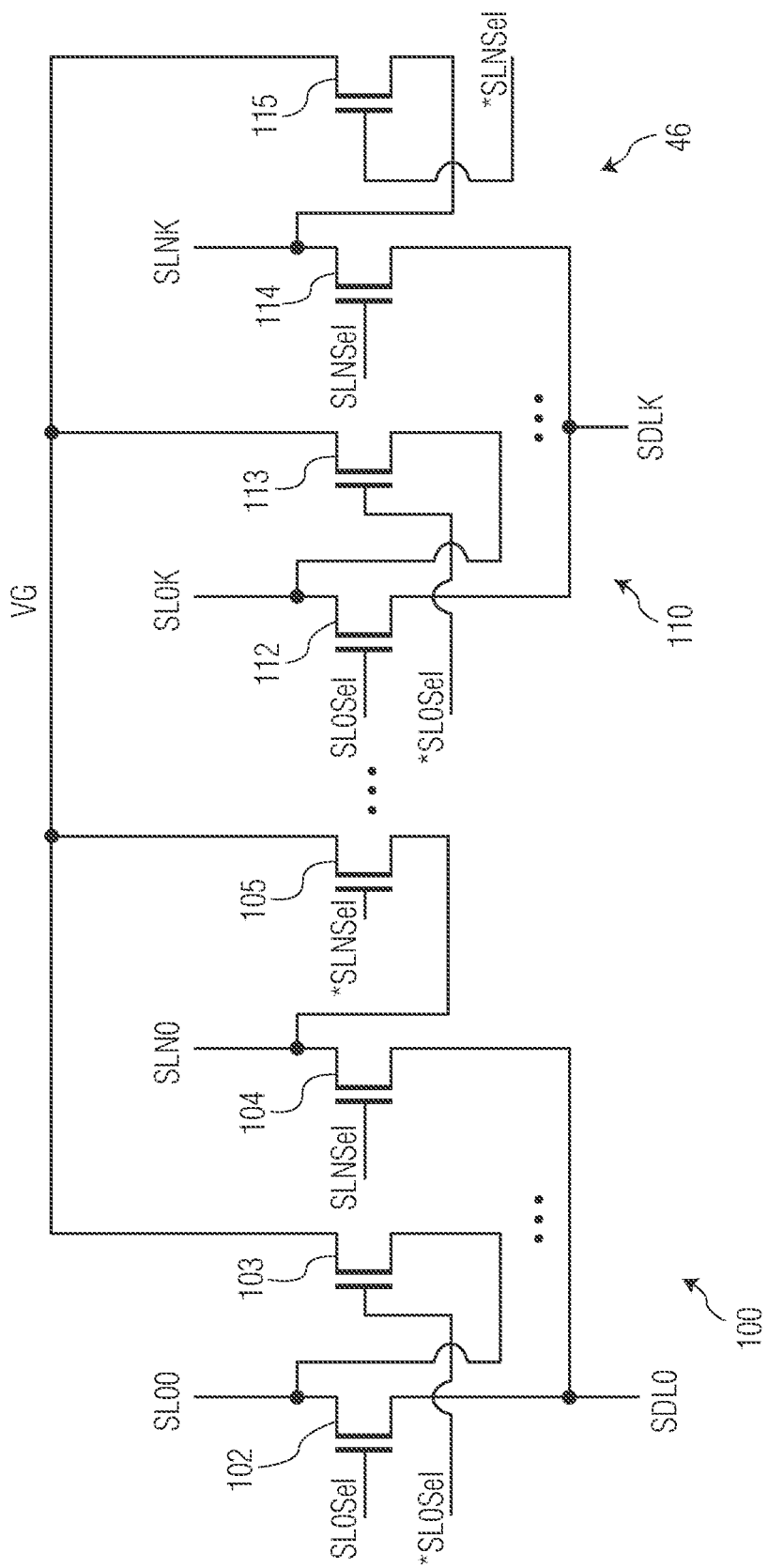
FIG. 2 is a circuit diagram of a source line multiplexer of the non-volatile memory circuit of FIG. 1, according to one embodiment of the present invention.

FIG. 2 is a circuit diagram that shows a portion of source line multiplexer 46 which receives control signals SL0Sel-SLNSel and the corresponding complementary signals *SL0Sel-*SLNSel. For each memory read or write operation (e.g. when either RD_EN or WR_EN is asserted), one of N+1 bit lines in each of the K+1 groups is selected. Therefore, for each memory operation, one of SL0Sel-SLNSel is asserted (to a logic level high) by SL decoder 50 based on a portion of the received access address from controller 20. Multiplexer 46 includes K+1 number of source line multiplexer circuits (100,110) for coupling one of a set of N source lines (e.g. SL00-SLN0 or SL0K-SLNK) to a corresponding source data line (e.g. SDL0 or SDLK) during a memory operation. In the embodiment shown, each multiplexer circuit (e.g. 100) includes 2*(N+1) mux transistors. The mux transistors of each multiplexer circuit (e.g. 100) include a coupling transistor (e.g. 102, 104) for each source line (e.g. SL00, SLN0, respectively) for coupling the selected source line to the source data line (SDL0) during a memory operation. Each multiplexer circuit (e.g. 100) also includes a deselect transistor (e.g. 103, 105) for each source line (e.g. SL00, SLN0, respectively) for coupling an unselected source line to the VG node to receive the VG voltage during a memory operation. Multiplexer circuit 110 includes coupling transistors 112 and 114 and deselect transistors 113 and 115.

The gates (control electrodes of a FET) of the coupling transistors (102, 104, 112, and 114) are controlled by control signals (SL0Sel-SLNSel). One of the control signals (SL0Sel-SLNSel) is asserted to a logic level high to couple the selected set of K+1 source lines to the corresponding K+1 source data lines (SDL0-SDLK) with one source line for each multiplexer circuit (100, 110) being coupled to the respective source data line (SDL0, SDLK) during the memory operation (with RD_EN or WR_EN asserted to indicate a read or a write operation, respectively). The gates of deselect transistors (103, 105, 113, and 115) are controlled by complementary control signals (*SL0Sel-*SLNSel). Each complementary control signal (of *SL0Sel-*SLNSel) corresponding to unselected source lines is asserted to a logic level high to couple the unselected source lines to VG during the memory operation. During the memory operation, for each multiplexer circuit (100, 110), N bit lines would be unselected and would be coupled to VG.

Figure 3:
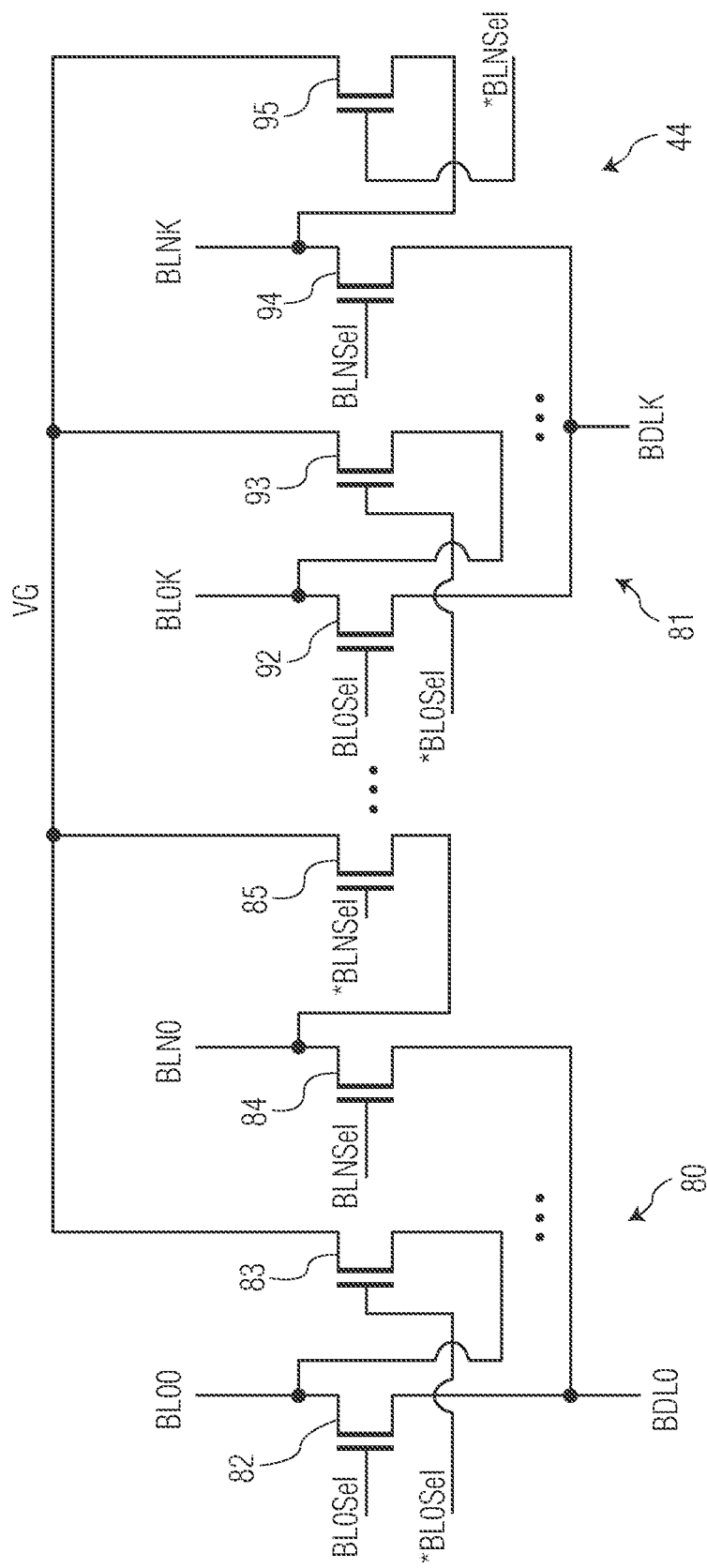
FIG. 3 is a circuit diagram of a bit line multiplexer of the non-volatile memory circuit of FIG. 1, according to one embodiment of the present invention.

FIG. 3 is a circuit diagram that shows a portion of bit line multiplexer 44 which receives control signals BL0Sel-BLNSel and the corresponding complementary signals *BL0Sel-*BLNSel. For each write operation (when WR_EN is asserted to indicate a write operation), one of N+1 bit lines in each of the K+1 groups is selected. Therefore, for each write operation, one of BL0Sel-BLNSel is asserted to a logic level high by BL decoder 48 based on a portion of the received access address from controller 20. Multiplexer 44 includes a K+1 number of bit line multiplexer circuits (80,81) for coupling one of a set of N+1 bit lines (e.g. BL00-BLN0) to a corresponding bit data line (e.g. BDL0) during a memory write operation. In the embodiment shown, each multiplexer circuit (e.g. 80) includes 2*(N+1) mux transistors. The mux transistors of each multiplexer circuit (e.g. 80) include a coupling transistor (e.g. 82, 84) for each bit line (BL00, BLN0, respectively) for coupling the selected bit line to the bit data line (BDL0) during a memory write operation. Each multiplexer circuit (e.g. 80) also includes a deselect transistor (e.g. 83, 85) for each bit line (BL00, BLN0, respectively) for coupling an unselected bit line to the VG node to receive the VG voltage during a memory write operation. Multiplexer circuit 81 includes coupling transistors 92 and 94 and deselect transistors 93 and 95.

The gates (control electrodes of a FET) of the coupling transistors (82, 84, 92, and 94) are controlled by control signals (BL0Sel-BLNSel). One of the control signals (BL0Sel-BLNSel) is asserted to a logic level high to couple the selected set of K+1 bit lines to the K+1 bit data lines (BDL0-BDLK) with one bit line for each multiplexer circuit (80, 81) being coupled to the respective bit data line (BDL0, BDLK) during the memory write operation (with WR_EN asserted). The gates of deselect transistors (83, 85, 93, and 95) are controlled by complementary control signals (*BL0Sel-*BLNSel). Each complementary control signal (of *BL0Sel-*BLNSel) corresponding to unselected bit lines is asserted to a logic level high to couple the unselected bit lines to VG during the memory write operation. During the memory write operation, for each multiplexer circuit (80, 81), N bit lines would be unselected and would be coupled to VG.

However, at any time other than when a write operation is occurring (e.g. when WR_EN is negated, regardless of the value of RD_EN), there is no selection of any bit lines by the multiplexer circuits (80, 81). Instead, all of the control signals (BL0Sel-BLNSel) are negated to a logic level low and all of the complementary control signals (*BL0Sel-*BLNSel) are asserted to a logic level high so as to couple all bit lines to VG. Therefore, during a read operation in which RD_EN is asserted, BL decoder 48 does not provide the control signals and complementary control signals based on an address portion from controller 20 but instead provides these control signals to make all of the deselect transistors (e.g. 83, 85, 93, and 95) conductive such that all bit lines are coupled to VG. During a memory read operation, for each multiplexer circuit (80, 81), N+1 bit lines (rather than N bit lines as in write operations) would be coupled to VG.

Figure 4:
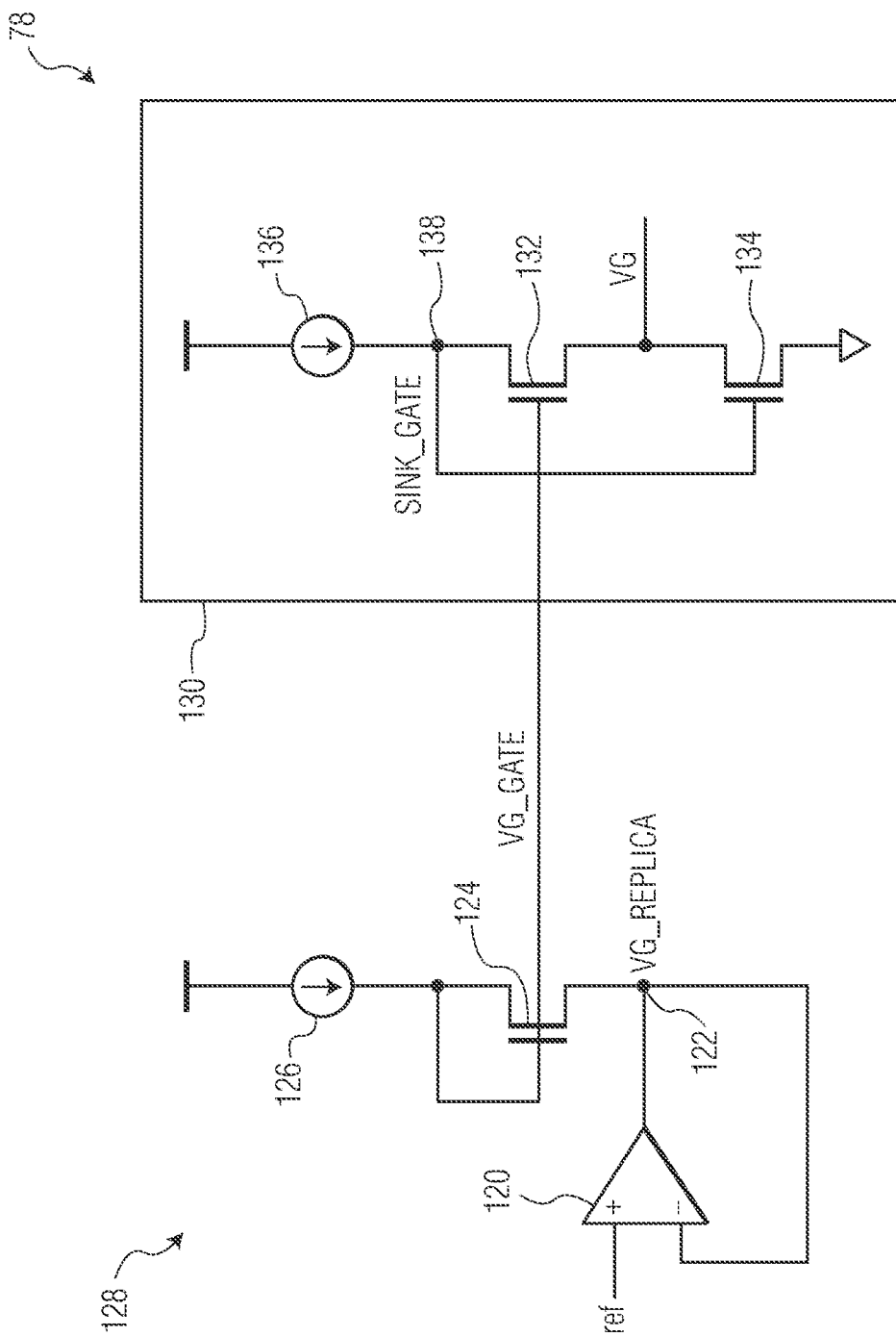
FIGS. 4 and 5 are circuit diagrams for the virtual ground (VG) circuitry of FIG. 1, in accordance with embodiments of the present invention.

FIG. 4 illustrates one embodiment of VG circuitry 78 of FIG. 1. VG circuitry 78 includes a VG replica generator circuit 128 coupled to a flipped voltage follower circuit 130. VG replica generator circuit 128 includes an operational amplifier (opamp) 120 having an output coupled to a circuit node 122, in which circuit node 122 provides a replica of the desired VG voltage, referred to as VG_REPLICA. Therefore, in one embodiment, VG_REPLICA is about 150 mV (which, in one embodiment, as discussed above in reference to FIG. 1, corresponds to the desired voltage level of VG). Opamp 120 has a first (e.g. non-inverting) input coupled to receive a reference voltage, REF, and a second (e.g. inverting) input coupled to node 122, and regulates the voltage on node 122 to match REF. VG replica generator circuit 128 includes a current source 126 having a first terminal coupled to VDD, and a second terminal coupled to a first current electrode of a transistor 124. A second current electrode of transistor 124 is coupled to circuit node 122, and a control electrode of transistor 124 is coupled to the first current electrode of transistor 124. The first gate electrode of transistor 124 provides a voltage, VG_GATE, to the control electrode of transistor 124 and to a control electrode of a transistor 132 within flipped voltage follower circuit 130. The voltage VG_GATE controls the current through transistor 124 and transistor 132.

Flipped voltage follower 130 circuit includes a current source 136, and transistors 132 and 134. In the illustrated embodiment, each of transistors 124, 132, and 134 are N-type transistors. Transistor 132 may be referred to as a source follower device or source follower transistor and transistor 134 as a sink device or sink transistor. A first terminal of current source 136 is coupled to VDD, and a second terminal is coupled to a circuit node 138 at a first current electrode of transistor 132. A second current electrode of transistor 132 is coupled to a first current electrode of transistor 134 and also provides the VG voltage to the VG nodes. A second current electrode of transistor 134 is coupled to VSS (e.g. ground), and a control electrode of transistor 134 is coupled to node 138 to receive the voltage SINK_GATE.

In operation, opamp 120 generates VG_REPLICA which, assuming transistors 124 and 132 are sized the same, results in close to the same value being generated at VG by flipped voltage follower 130. VG replica circuit 128 provides VG_GATE from the first current electrode of transistor 124 to transistor 132. Transistor 132 operates as a source follower producing the VG voltage at its second current electrode. Sink device 134 operates to sink excess current from node 138 which is introduced during the read operation. For example, during the read operation, the forced read current, I, is provided to both the selected source line coupled to the selected bit cell and the reference current path, resulting in the VG node receiving a current that is 2 times I (2I) for each of the K+1 columns. Therefore, sink device 134 coupled to node 138 operates as a voltage detector which reduces the additional current during reads by pulling VG down as needed, based on the voltage SINK_GATE, to keep VG stable at the VG voltage.

In one embodiment, VG replica generator circuit 128 is placed in one place, globally shared within system 10. Flipped voltage follower 130, which actually drives VG, can be placed in one or more places within system 10. That is, one or more of these circuits can be distributed with each sense amplifier, all receiving VG_GATE from the global VG generator circuit.

Figure 5:
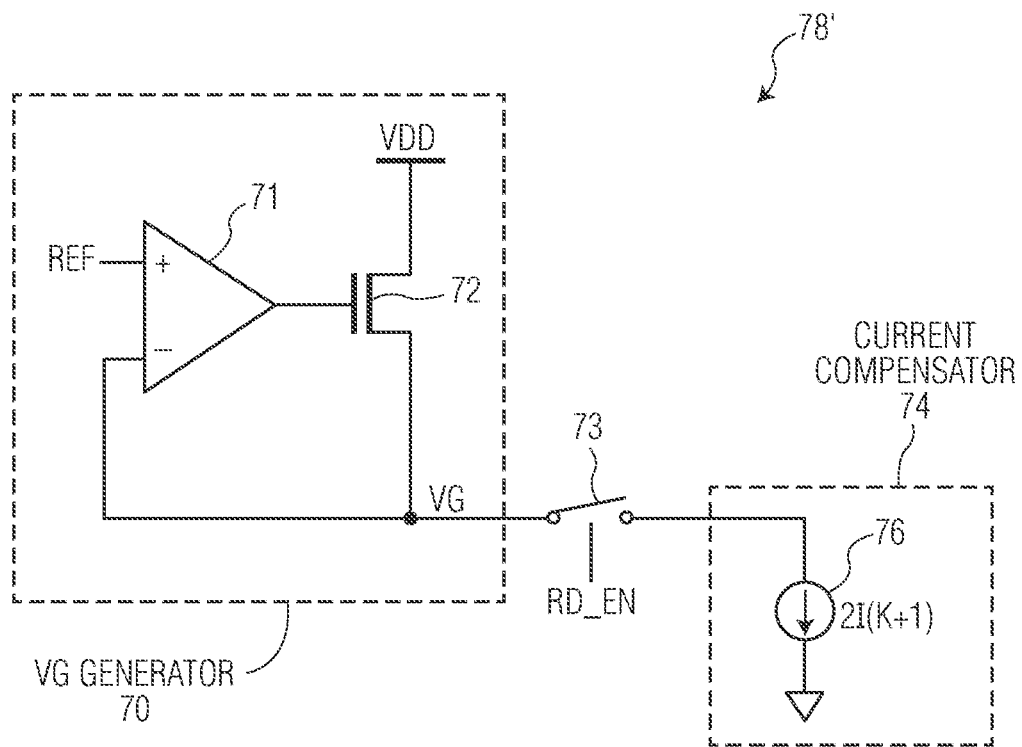

FIG. 5 illustrates VG circuitry 78' which is an alternate embodiment of VG circuitry 78 of FIG. 1. VG circuitry 78' includes a VG Generator 70 and a current compensator 74 coupled to VG generator 70 via a switch 73. VG generator 70 is implemented as a source follower amplifier to set the VG voltage. VG generator includes an amplifier 71 having a first input (e.g. non-inverting input) coupled to receive a reference voltage, a second input (e.g. inverting input) coupled to the VG node, and an output coupled to a control electrode of an NMOS transistor 72. Transistor 72 has a first current electrode coupled to VDD and a second current electrode coupled to the second input of amplifier 71 and the VG node. The second current electrode of transistor 72 generates the VG voltage at the VG node to match the reference voltage.

Memory circuit 10 also includes a current compensator circuit 74 which is coupled to the VG node via a switch 73 controlled by RD_EN. Current compensator 74 includes a current source 76 which generates a current "2I(K+1)" (i.e., a current that is twice the amount of the forced read current (I) generated by each current load device (e.g. 51, 57) in read circuitry 18 for the K+1 columns). Therefore, during a read operation (when RD_EN is asserted), current compensator 74 removes extra charge from the VG node introduced by the current load devices (e.g. 51 and 57) during each read operation. In this manner, VG is stabilized and maintained at the same voltage level, even after multiple read operations.

Figure 6:
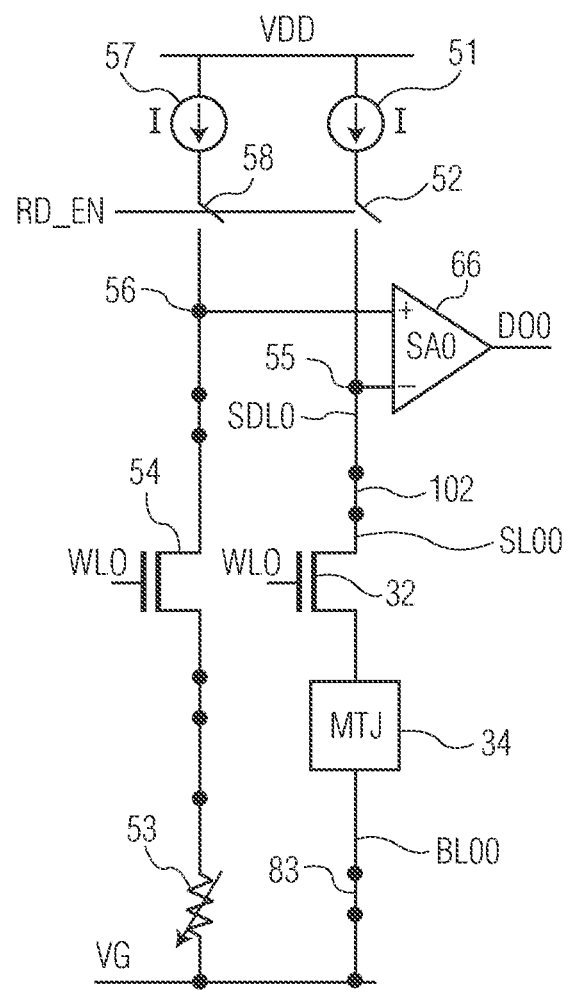
FIG. 6 is a circuit diagram showing a portion of the non-volatile memory circuit of FIG. 1 during a read operation according to one embodiment of the present invention.

FIG. 6 illustrates a portion of memory circuit 10 during a read operation, assuming that the corresponding access address selects bit cell 32 at the intersection of WL0 and SL00, which provides D00. Note that during such a read operation, each bit cell at the intersection of WL0 and the selected source lines (e.g. SL01, SL02, SL03, SL0K) would also be read to provide D00-D0K. During a read operation, RD_EN is asserted and thus enable switches 58, 52, and 73 (if VG circuitry 78' is used) are all closed (conductive) so as to provide the forced read current, I, through each of the selected source lines (e.g. SL00) and the corresponding reference paths.

For example, the forced read current, I, is provided via closed enable switch 52 to SDL0 which is coupled to SL00 by coupling transistor 102 in SLMUX 46 (illustrated as a closed switch in FIG. 4). The current flows through select transistor 32 and MTJ 34 of selected bit cell 23 to the corresponding bit line, BL00, which is coupled to the VG node via deselect transistor 83 of BL MUX 44 (illustrated as a closed switch in FIG. 4). The forced current is also provided via closed enable switch 58 through the corresponding reference path which includes reference select transistor 54, whose gate also receives the word line voltage which is applied to the selected word line (WL0) and reference resistor (RR0 53). Reference resistor RR0 53 is coupled between reference select transistor 54 and the VG node. The resulting voltages at nodes 56 and 55 are compared by sense amplifier SA0 66 to output the stored bit value as D00. For example, if the voltage at node 56 is greater than the voltage at node 55, D00 has a bit value of "1", otherwise D00 has a bit value of "0".

In the case that the VG circuitry is implemented as VG circuitry 78 of FIG. 4, sink device 134 maintains the stability of VG by sinking additional current introduced during reads. The stability is maintained, even over a series of read operations. In the case that the VG circuitry is implemented as VG circuitry 78' of FIG. 5, the VG node is coupled, via closed switch 73, to current source 76 of current compensator 74, which is coupled to VSS (e.g. ground). Since the forced read current, I, is provided to both the selected source line coupled to the select bit cell and the reference current path, the VG node receives 2 times I (2I) for each of the K+1 columns. Without the presence of current compensator 74, then over a series of read operations, the charge on node VG would increase with each read operation. However, with the presence of current compensator 74, current source 76 balances the extra charge on the VG node resulting from the total forced read current, 2I(K+1), that is provided to the VG node. This allows the VG node to steadily maintain its voltage level provided by virtual ground generator 70. Also, note that, regardless of how the VG circuitry is implemented, the VG circuitry is configured to stabilize the VG voltage at the VG node, and the remaining unselected portions of array 12 provide a column line stability capacitance which further helps stabilize the VG voltage.

As discussed above, alternate embodiments may perform read operations using the bit lines instead of the source lines. In this embodiment, referring to the example of FIG. 6, instead of providing the forced read current, I, through closed enable switch 52 to SDL0 and SL00, through select transistor 32, through MTJ 34, to BL00, then to VG, the forced read current would instead be provided thorough a closed enable switch to BDL0 and BL00, though MTJ 34, through select transistor 32, to SL00, then to VG. That is, in this embodiment, in SLMUX 46, all source lines will be coupled to VG, and in BLMUX, any unselected bit lines will be coupled to VG. In this embodiment, BDL0-BDLK would be provided to corresponding sense amplifiers SA0-SAK of read circuitry 18 rather than SDL0-SDLK.

The use of VG during read operations for the unselected source lines and all the bit lines, as described in reference to FIGS. 2 and 3 above, (or alternatively, for unselected bit line and all the source lines) may help reduce memory bit leakage during the read operations. Also, since the VG voltage can be close to true ground (in one embodiment, only 150 mV greater than true ground), there is minimal to no impact on the write performance for write operations which may utilize true ground (e.g. in the bit line and source line drivers of the write circuitry). There is no inherent access time penalty due to the presence of a VG voltage in this sensing scheme.

Figure 7:
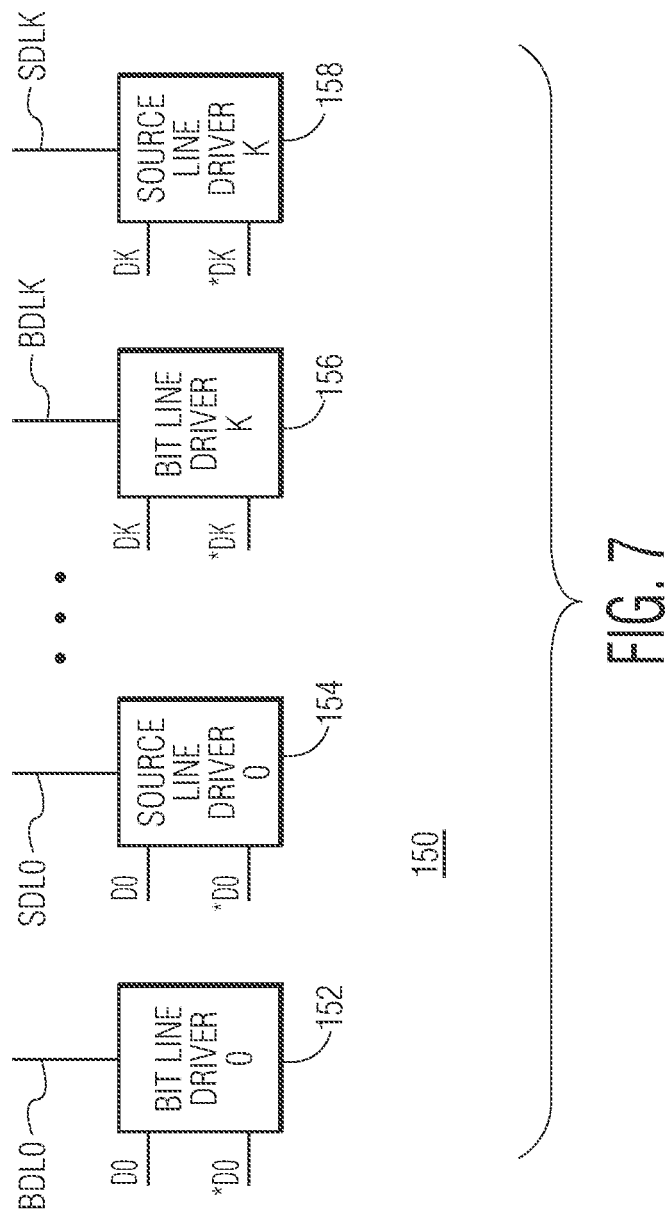
FIG. 7 is a block diagram of write circuitry of the a non-volatile memory circuit according to one embodiment of the present invention.

FIG. 7 illustrates a more detailed view of write circuitry 150 in accordance with one embodiment of the present invention. Each bit data line (BDL0-BDLK) is coupled a corresponding bit line driver (e.g. 152, 156) and each source data line (SDL0-SDLK) is coupled to a corresponding source line driver (e.g. 154, 158). Each bit line driver and each source line driver receive a corresponding data value of D0-DK and complementary data value of *D0-*DK. For example, bit line driver 0 152 is coupled to BDL0 and receives D0 and *D0 and bit line driver K 156 is coupled to BDLK and receives DK and *DK. Similarly, source line driver 0 154 is coupled to SDL0 and receives D0 and *D0 and source line driver K 158 is coupled to SDLK and receives DK and *DK.

Figure 8:
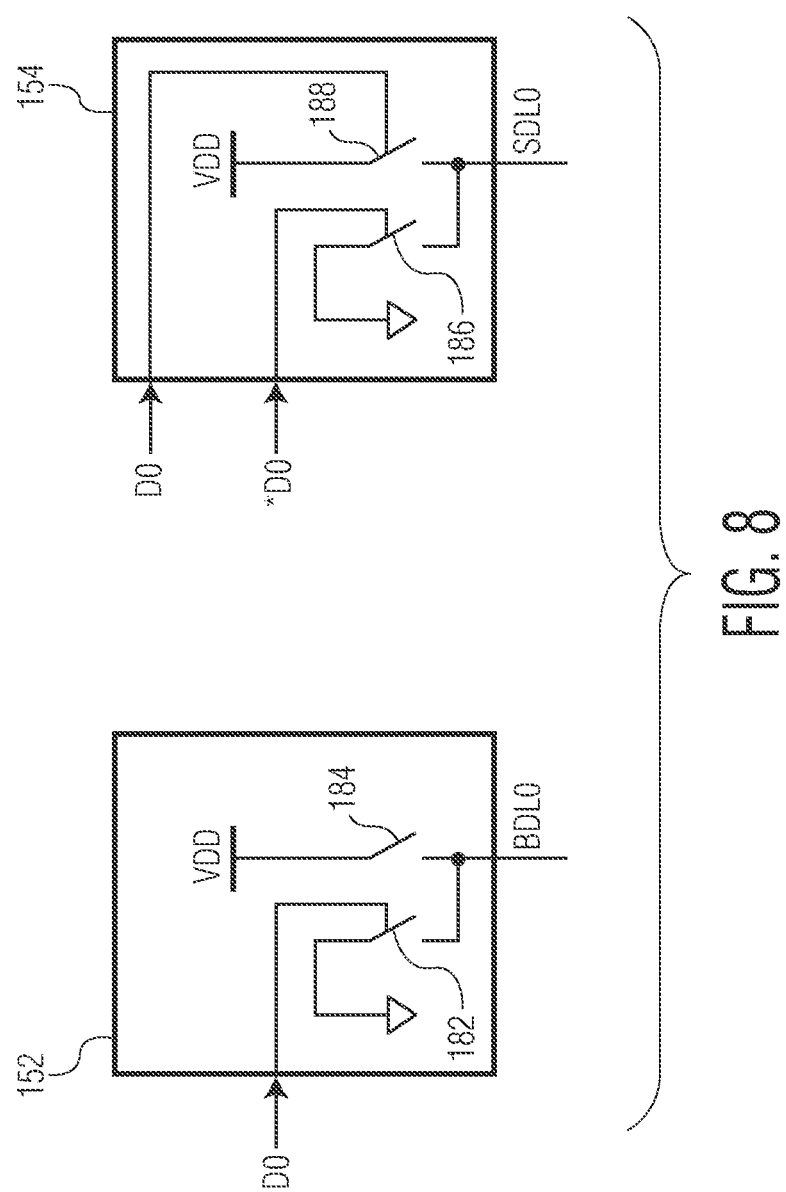
FIG. 8 is a circuit diagram of write driver circuit of the write circuitry of FIG. 7 according to one embodiment of the present invention.

FIG. 8 is a circuit diagram of bit line driver circuit 152 and source line driver circuit 154. Other bit line driver circuits (156) and source line driver circuits (158) are configured accordingly. Driver circuit 152 includes a grounding switch 182 for coupling the bit data line (BDL0) to ground and a switch 184 for coupling bit data line (BDL0) to a write voltage of VDD during a data write to a selected memory cell of the bit line, depending on the value of the data signal D0 and complementary data signal *D0, which control the conductivity of the switches respectively. When D0 is high and *D0 is low, switch 182 is closed and switch 184 is open such that bit data line BDL0 is grounded. When D0 is low and *D0 is high, switch 182 is open and switch 184 is closed to pull bit data line BDL0 to the high write voltage VDD.

Source line driver circuit 154 includes a grounding switch 186 for coupling the source data line (SDL0) to ground and a switch 188 for coupling source data line (SDL0) to a write voltage of VDD during a data write to a selected memory cell, depending on the value of the complementary data signal *D0 and the data signal D0, which control the conductivity of the switches respectively. When *D0 is high and D0 is low, switch 186 is closed and switch 188 is open such that source data line SDL0 is grounded. When *D0 is low and D0 is high, switch 186 is open and switch 188 is closed to pull source data line SDL0 to the high write voltage VDD.

Thus, when data signal D0 is high and the complementary data signal *D0 is low, the bit data line (BDL0) is grounded and the source data line (SDL0) is pulled to VDD to write a "1" value to the selected memory cell coupled between the source data line and bit data line during a write operation. When data signal D0 is low and the complementary data signal *D0 is high, the bit data line (BDL0) is pulled to VDD and the source data line (SDL0) is grounded to write a "0" value to the selected memory cell coupled between the source data line and bit data line during a memory write operation. In some embodiments, the switches are implemented with NMOSFETs but may be implemented with other types of switches (e.g. pass gates) in other embodiments.

Figure 9:
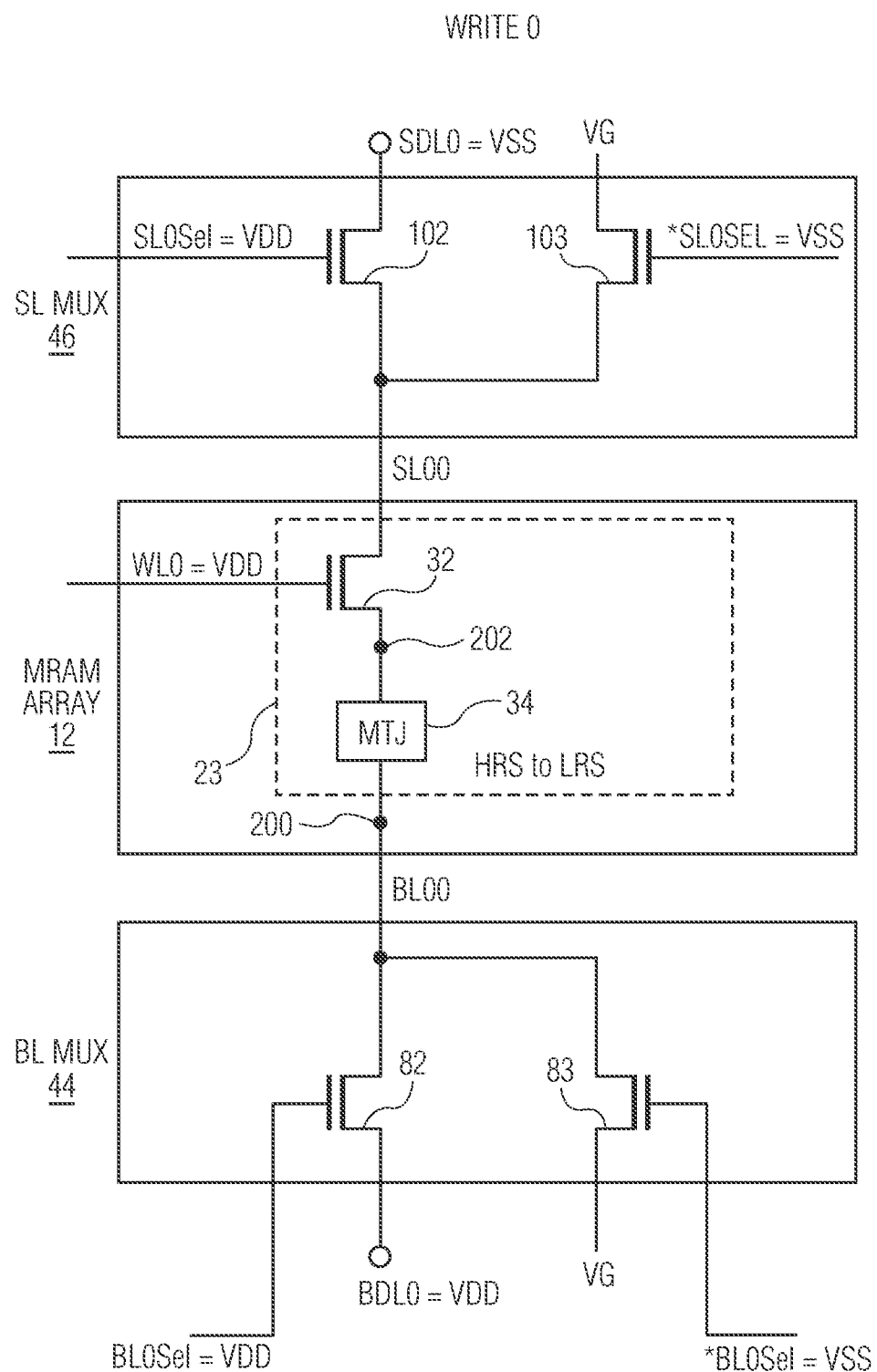
FIG. 9 is a circuit diagram showing voltages applied to nodes during a write operation to a memory cell according to one embodiment of the present invention.
Figure 10:
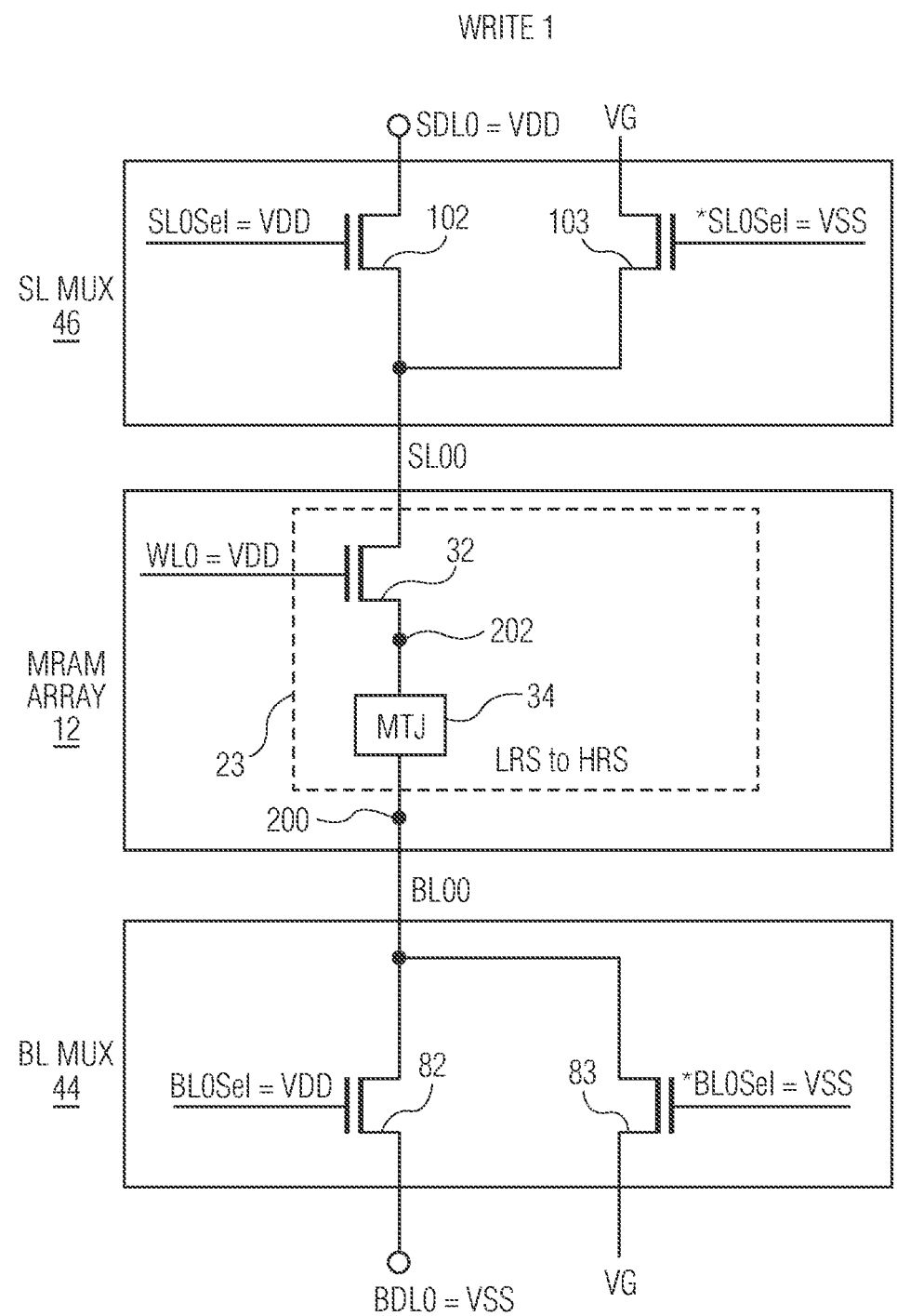
FIG. 10 is a circuit diagram showing voltages applied to nodes during a write operation to a memory cell according to one embodiment of the present invention.
Figure 11:
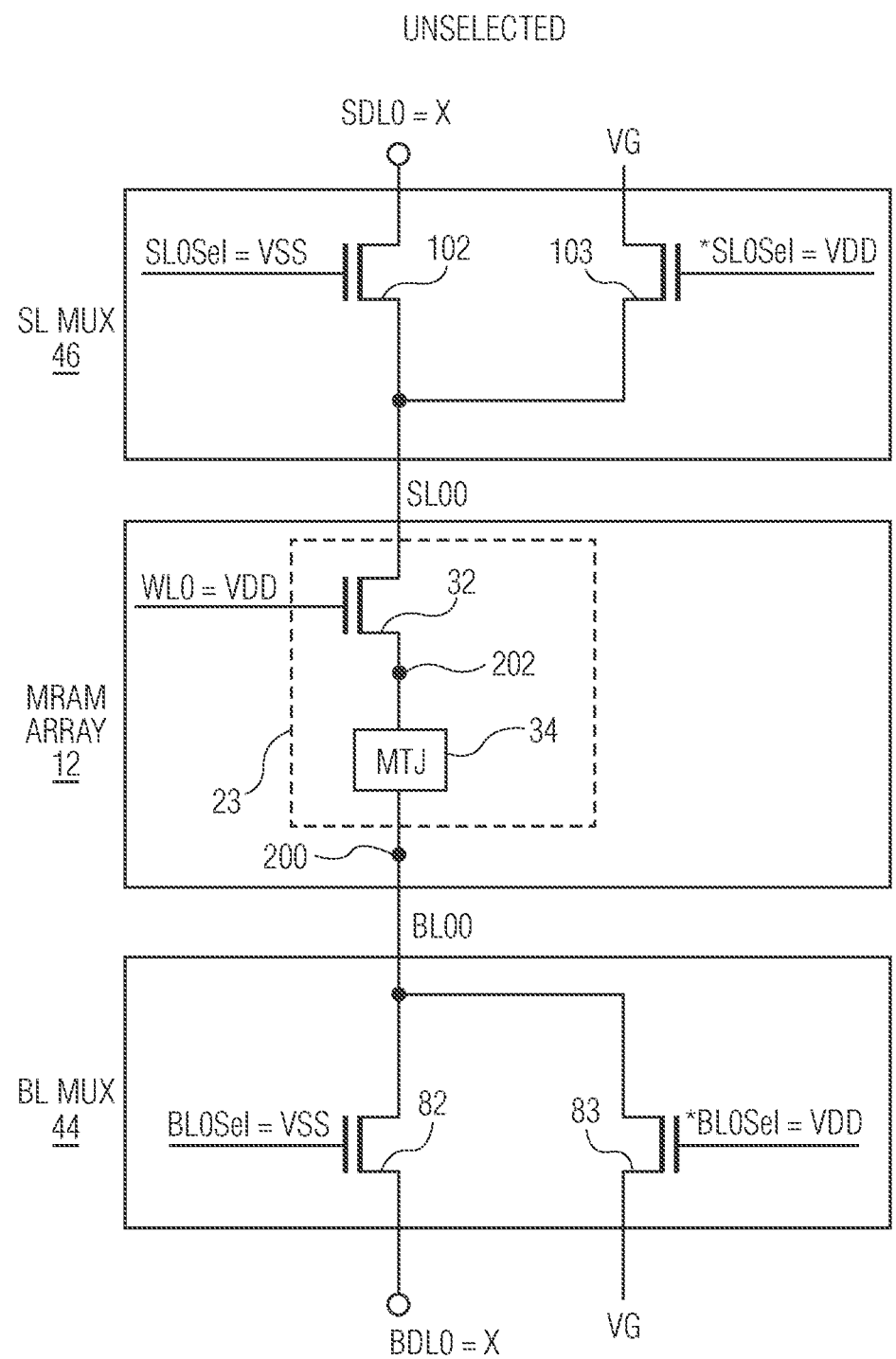
FIG. 11 is a circuit diagram showing voltages applied to nodes coupled to an unselected memory cell during a memory operation according to one embodiment of the present invention.

FIGS. 9-11 are circuit diagrams showing the voltage levels of the different signals for performing memory operations with respect to memory cell 23. Memory operations to the other cells of array 12 may be performed in a similar manner. Memory cell 23 includes select transistor 32 whose gate is controlled by word line WL0 and includes a resistive storage element (34) which in the embodiment shown is an MJT of an MRAM cell. Memory cell 23 is coupled to source line SL00 and bit line BL00. Source line SL00 can be tied to source data line SDL0 via coupling transistor 102 of source multiplexer 46 when SL0Sel is asserted to a logic level high such that VDD is applied to the gate of coupling transistor 102. Source line SL00 is coupled to VG via conductive deselect transistor 103 of source multiplexer 46 when signal *SL0Sel is a logic level high. Bit line BL00 can be tied to bit data line BDL0 via coupling transistor 82 of bit line multiplexer 44 when the BL0Sel is asserted high such that VDD is applied to the gate of coupling transistor 82. Bit line BL00 is coupled to VG via conductive deselect transistor 83 of bit line multiplexer 44 when signal *BL0Sel is at a logic level high. When any of the coupling or deselect transistors receive a logic level low (corresponding to VSS) at the corresponding gate electrode, the transistor is non-conductive. During a memory write, SLSel0 and *SLSel0 are provided by SL decoder 50, and BL0Sel and *BL0Sel by BL decoder 48.

In one embodiment of a resistive memory array where the memory cells each include an MTJ as the resistive storage element, when current flows through the resistive storage element of a memory cell in a first direction, the memory cell is written to a low resistive state (LRS) in which the magnetic moments of the interacting magnetic layers of the MTJ are aligned in the same direction, and when current flows in a second direction, opposite the first direction, through the resistive storage element, the memory cell is written to a high resistive state (HRS) in which the magnetic moments of the interacting magnetic layers of the MTJ are not aligned in the same direction. In one embodiment, an HRS corresponds to a logic level "1" and an LRS corresponds to a logic level "0". However, in alternate embodiments, the LRS may correspond to the logic level "1" and the HRS to the logic level "0". In one embodiment, the resistance of the HRS is 2-3 times the resistance of the LRS, in which the resistance of the LRS may be in a range of 2 k-8 k Ohms.

FIG. 9 shows the voltages applied when a logic level "0" is written to memory cell 23, which in the embodiment shown is indicated by the resistive element 34 being in an LRS. In some instances, prior to being written with a "0", resistive element 34 is in an HRS indicating that a logic level "1" is being stored. To write a "0" value to cell 23 from a "1" value, resistive storage element 34 is placed in an LRS from a HRS. In the embodiment shown, to change the resistive state of an MTJ to an LRS, a write current (e.g. of 60 microamps (uA)) is provided in the "up" direction (relative to the view of FIG. 9) through the MTJ where node 200 is at higher voltage than node 202 to align the magnetic moments of the MTJ of resistive storage element 34. Because the data signal *D0 is at a high value (to indicate that a "0" is to be written), a write voltage of VDD is applied to the bit data line BDL0 via a closed switch 184 of bit line driver circuit 152 and the source data line SDL0 is grounded (at VSS) by a closed switch 186 of source write driver circuit 154 (see FIG. 8). Control signal SL0Sel is asserted high (at VDD) which makes transistor 102 conductive, and select transistor 32 is made conductive by an asserted word line WL0 (at VDD) to pull node 202 towards ground. Signal BL0Sel is also high (at VDD) which makes transistor 82 conductive to tie BL00 to BDL0 and pull the voltage of node 200 to VDD. This results in a current through MTJ 34 to align the magnetic moments of the MTJ of storage element 34 to an LSR from an HSR.

FIG. 10 shows the voltages applied when a logic level "1" is written to memory cell 23. As opposed to the condition of FIG. 9, current is applied in the downward direction (relative to the view of FIG. 10) through storage element 34. In some instances, prior to being written with a "1", resistive element 34 is in an LRS indicating that a "0" is being stored. To write a "1" value to cell 23 from a "0" value, resistive storage element 34 is placed in an HRS from an LRS. In the embodiment shown, to change the resistive state of an MTJ to an HRS, a high current of 80 microamps (uA) is provided in the "down" direction (relative to the view of FIG. 10) through the MTJ where node 202 is at a higher voltage than node 200 to change the moments of the MTJ to be anti-parallel. Because the data signal D0 is at a high value (to indicate that a "1" is to be written), a write voltage of VDD is applied to the source data line SDL0 via a close switch 188 of source line driver circuit 154 and the bit data line BDL0 is grounded at VSS by a closed switch 182 of bit line write driver circuit 152 (see FIG. 8). Control signal BL0Sel is high (at VDD) which makes transistor 82 conductive to pull node 200 towards VSS. Select transistor 32 is made conductive by an asserted word line WL0 (at VDD). Signal SL0Sel is high (at VDD) which makes transistor 102 conductive to pull node 202 to VDD, which results in a sufficient current to change the moments of the MJT of storage element 34 to be unaligned.

During the write of "0" or "1" to memory cell 23, since SL0Sel and BL0Sel are asserted to select memory cell 23, *SL0Sel and *BL0Sel are negated so as to apply VSS to the gates of deselect transistors 103 and 83. This results in making these deselect transistors non-conductive so as not to connect SL00 or BL00 to VG. However, note that in MUX circuit 100 of SLMUX 46 (see FIG. 2), the remaining deselect transistors corresponding to SL10-SLN0 (e.g. deselect transistor 105) are made conductive so that each of SL10-SLN0 (the unselected source lines) are coupled to VG during the write. Similarly, in MUX circuit 80 of BLMUX 44 (see FIG. 3), the remaining deselect transistors corresponding to BL10-BLN0 (e.g. deselect transistor 85) are made conductive so that each of BL10-BLN0 (the unselected bit lines) are also coupled to VG during the write.

For example, FIG. 11 shows the voltages when memory cell 23 is in an unselected column of a memory operation (during either a read or a write). In the embodiment shown, cell 23 is in a selected row in that word line WL0 is at an asserted voltage value of VDD. However, the voltages of the other signals would be the same if cell 23 where in an unselected row. As discussed above, signal *SL0Sel is high (at VDD) to connect source line SL00 through transistor 103 to VG. Signal *BL0Sel is also high (at VDD) to connect bit line BL00 through transistor 83 to VG. Signals SL0Sel and BL0Sel are both at a low voltage state (at VSS) to isolate source line SL00 from source data line SDL0 and to isolate bit line BL00 from bit data line BDL0. Note that the voltage conditions of control signals SL0Sel, *SL0Sel, BL0Sel, and *BL0Sel may be the same when no memory operation is being performed.

Write endurance of NVM circuit 10 is dependent upon the amount of voltage which can be applied to gate oxides as well as stress duration for both the select gate of a bit cell as well as for the gates of devices in the MUX circuits. During write operations, by source biasing the unselected source lines and unselected bit lines at VG rather than true ground, time-dependent gate oxide breakdown (TDDB) caused by transistor aging may be reduced, thus lengthening the lifetime (i.e. longevity) of NVM circuit 10. As illustrated in the examples of FIGS. 9-11, various transistors within NVM circuit 10 receive voltages at their gate electrodes, resulting in TDDB stress on these transistors. For example, the select transistors (e.g. transistor 32), as well as the deselect transistors (e.g. 103 and 83) of unselected source lines and unselected bit lines, receive VDD at their gates, resulting in TDDB stress. This stress is reduced, though, by connecting the unselected source lines and bits lines to VG rather than true ground, because with VG>true ground, the voltage differential between the gate and source is thereby reduced. Furthermore, note that by source biasing the deselect transistors of the unselected source lines and unselected bit lines, stress is reduced on all the unselected deselect transistors (e.g. 103 and 83) in the MUX circuits, which out-number the selected coupling transistors (e.g. 102 and 82) of the MUX circuits. For example, in the MUX circuits of SLMUX 46 or BLMUX 44, for a write operation, the gate of a selected one of the N+1 coupling transistors in each group of the K+1 groups receives VDD, while the gates of the unselected N of the N+1 deselect transistors in each of the K+1 groups receive VDD.

In an alternate embodiments, the use of VG during write operations for source biasing unselected source lines and unselected bit lines can be used to reduce TDDB stress in other types of NVM memories, such as other types of resistive RAMs.

It can be appreciated how a VG voltage can be utilized during read operations to reduce leakage current in a resistive memory array. In one embodiment, during a read operation, all unselected source lines and all bit lines are biased at the virtual ground level rather than true ground. Alternatively, depending on the design of the memory array, all unselected bit lines and all source lines are biased at the virtual ground level rather than true ground. This biasing may reduce leakage currents. During a read operation, all voltage levels are elevated relative to the virtual ground, resulting in little to no time (performance) penalty as compared to the use of true ground. It can also be appreciated how the VG voltage can be utilized during write operations to reduce TDDB stresses within an NVM circuit, such as a resistive memory circuit. In one embodiment, during a write operation, all unselected source lines and all unselected bit lines are biased at the virtual ground level rather than true ground. In one embodiment, the VG voltage can be properly maintained and stabilized by using a VG replica voltage and a flipped follower voltage circuit to generate the VG voltage, in which the flipped follower voltage circuit includes a sink device to remove additional current generated during reads. Alternatively, a regulated source follower amplifier can be used to provide the VG voltage, and a current compensator can be used during read operations to compensate for the additional charge on the VG node, thus maintaining the VG node charge neutral.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

In one embodiment, a non-volatile memory includes virtual ground circuitry coupled to a first power supply terminal and a second power supply terminal and configured to generate a virtual ground voltage at a virtual ground node, wherein the first power supply terminal is configured to provide a first power supply voltage and the second power supply terminal is configured to provide a second power supply voltage which is less than the first power supply voltage, wherein the virtual ground voltage is greater than zero volts and is between the first power supply voltage and the second power supply voltage; a memory array of memory cells, each memory cell of the memory array including a select transistor and a storage element for storing a value, wherein each memory cell is coupled to a first column line of a plurality of first column lines; a first decoder configured to select a set of first column lines from the plurality of first column lines for a memory write operation to a selected set of the memory cells coupled to the selected set of first column lines; write circuitry configured to receive a write value for storage into the selected set of memory cells during the memory write operation; and a first column line multiplexer (MUX) configured to couple each selected first column line of the set of first column lines to the write circuitry during the memory write operation, and configured to couple each unselected first column line of the plurality of first column lines to the virtual ground node during the memory write operation. In one aspect, each memory cell of the memory array is coupled to a second column line of a plurality of second column lines, and the memory further includes a second column line multiplexer (MUX) configured to couple each selected second column line of the set of second column lines to the write circuitry during the memory write operation, and configured to couple each unselected second column line of the plurality of second column lines to the virtual ground node during the memory write operation. In a further aspect, the plurality of first column lines are characterized as one of source lines or bit lines, and the plurality of second column lines are characterized as another one of the source lines or bit lines. In another aspect, the virtual ground circuitry includes a flipped voltage follower circuit having a current source coupled in series with a source follower transistor and a sink transistor between the first power supply terminal and the second power supply terminal, wherein a first current electrode of the source follower transistor is coupled to the current source, and a second current electrode of the source follower transistor is coupled to the virtual ground node. In a further aspect, a first current electrode of the sink transistor is coupled to the virtual ground node, a second current electrode of the sink transistor is coupled to the second power supply terminal, and a control electrode of the sink transistor is coupled to the first current electrode of the source follower transistor. In yet a further aspect, the virtual ground circuitry further includes an operational amplifier having an output configured to provide a replica virtual ground voltage; a transistor having a first current electrode, a control electrode, and a second current electrode, wherein the second current electrode of the transistor is coupled to the output of the operational amplifier, and the first current electrode of the transistor is coupled to the gate electrode of the transistor and to the gate electrode of the source follower transistor; and a second current source coupled between the first power supply terminal and the first current electrode of the transistor. In another aspect of the above embodiment, the virtual ground circuitry includes a current compensator coupled to the virtual ground node via a first enable switch, wherein the first enable switch is configured to be conductive to couple the current compensator to the virtual ground node during a memory read operation. In a further aspect, the current compensator includes a compensator current source coupled between the first enable switch and the second power supply terminal. In yet another aspect of the above embodiment, the virtual ground circuitry includes a source follower amplifier, in which a transistor of the source follower amplifier has a first current electrode coupled to the first power supply terminal, a control electrode coupled to an output of an amplifier of the source follower amplifier, and a second current electrode coupled to the virtual ground node. In another aspect, the storage element in each memory cell of the memory array is characterized as a resistive storage element. In yet another aspect, the write circuitry includes a first set of drivers configured to couple each selected first column line of the set of first column lines to one of the first power supply or the second power supply terminal based on the write value. In another aspect, the write circuitry includes a first set of drivers configured to couple each selected first column line of the set of first column lines to one of the first power supply or the second power supply terminal based on the write value; and a second set of drivers configured to couple each selected second column line of the set of second column lines to one of the first power supply terminal or the second power supply terminal based on the write value.

In another embodiment, a non-volatile memory includes virtual ground circuitry coupled to a first power supply terminal and a second power supply terminal and configured to generate a virtual ground voltage at a virtual ground node, wherein the first power supply terminal is configured to provide a first power supply voltage and the second power supply terminal is configured to provide a second power supply voltage which is less than the first power supply voltage, wherein the virtual ground voltage is at least 100 mV greater the second power supply voltage and less than the first power supply voltage; a memory array of memory cells, each memory cell of the memory array including a select transistor and a storage element for storing a value, wherein each memory cell is coupled to a source line of a plurality of source lines and to a bit line of a plurality of bit lines; a decoder configured to select a set of source lines from the plurality of source lines and a set of bit lines from the plurality of bit lines for a memory write operation to a selected set of the memory cells coupled to the selected set of source lines and the selected set of bit lines; write circuitry configured to receive a write value for storage into the selected set of memory cells during the memory write operation; a source line multiplexer (MUX) configured to couple each selected source line of the set of source lines to the write circuitry during the memory write operation, and configured to couple each unselected source line of the plurality of source lines to the virtual ground node during the memory write operation; and a bit line MUX configured to couple each selected bit line of the set of bit lines to the write circuitry during the memory operation, and configured to couple each unselected bit line of the plurality of bit lines to the virtual ground node during the memory write operation. In one aspect, the second power supply voltage is true ground. In another aspect, the virtual ground circuitry includes a flipped voltage follower circuit having a current source coupled in series with a source follower transistor and a sink transistor between the first power supply terminal and the second power supply terminal, wherein a first current electrode of the source follower transistor is coupled to the current source, and a second current electrode of the source follower transistor is coupled to the virtual ground node. In yet another aspect, the write circuitry includes a set of drivers, each driver configured to receive a corresponding bit of the write value, a corresponding source line of the selected set of source lines, and a corresponding bit line of the selected set of bit lines and configured to, during the memory write operation, couple the corresponding source line to one of the first power supply or the second power supply terminal and the corresponding bit line to another one of the first power supply or the second power supply based on the corresponding bit of the write value.

In yet another embodiment, in a memory having a first power supply terminal configured to provide a first supply voltage, a second power supply terminal configured to provide a second supply voltage less than the first supply voltage, and a memory array of memory cells in which each memory cell is coupled to a first column line of a plurality of first column lines, a method includes selecting a set of first column lines from the plurality of first column lines for a memory write operation of a write value to a selected set of the memory cells coupled to the selected set of first column lines; and generating a virtual ground voltage at a virtual ground node, wherein the virtual ground voltage is greater than the second supply voltage, and less than the first power supply voltage. The method, during the write operation, further includes coupling all unselected first column lines of the plurality of first column lines to the virtual ground node; coupling each first column line of the selected set of first column lines to write circuitry configured to receive the write value, in which each memory cell of the selected set of memory cells stores a corresponding unique bit of the write value; and providing a current through each memory cell of the selected set of memory cells based on the write value, wherein, for each memory cell, the current is provided through the memory cell in a first direction when the corresponding unique bit has first value, and in a second direction, opposite the first direction, when the corresponding unique bit has a second value, different from the first value. In one aspect of the yet another embodiment, each resistive memory cell of the memory array is coupled to a second column line of a plurality of second column lines, and the method further includes coupling each second column line of the selected set of second column lines to the write circuitry during the memory write operation; and coupling all unselected second column lines of the plurality of second column lines to the virtual ground node during the memory write operation. In yet a further aspect, the plurality of first column lines are characterized as one of source lines or bit lines, and the plurality of second column lines are characterized as another one of the source lines or bit lines. In another further aspect, during the write operation, for each memory cell, the write circuitry couples the first column line of the selected set of first column lines coupled to the memory cell to one of the first power supply terminal and the second power supply terminal and couples the second column line of the selected set of second column lines coupled to the memory cell to another of the first power supply terminal and the second power supply terminal, based on a value of the corresponding unique bit.

What is claimed is:

1. A non-volatile memory comprising:
    virtual ground circuitry coupled to a first power supply terminal and a second power supply terminal and configured to generate a virtual ground voltage at a virtual ground node, wherein the first power supply terminal is configured to provide a first power supply voltage and the second power supply terminal is configured to provide a second power supply voltage which is less than the first power supply voltage, wherein the virtual ground voltage is greater than zero volts and is between the first power supply voltage and the second power supply voltage;
    a memory array of memory cells, each memory cell of the memory array including a select transistor and a storage element for storing a value, wherein each memory cell is coupled to a first column line of a plurality of first column lines;
    a first decoder configured to select a set of first column lines from the plurality of first column lines for a memory write operation to a selected set of the memory cells coupled to the selected set of first column lines;
    write circuitry configured to receive a write value for storage into the selected set of memory cells during the memory write operation; and
    a first column line multiplexer (MUX) configured to couple each selected first column line of the set of first column lines to the write circuitry during the memory write operation, and configured to couple each unselected first column line of the plurality of first column lines to the virtual ground node during the memory write operation,
    wherein the voltage ground circuitry comprises:
        a flipped voltage follower circuit having a current source coupled in series with a source follower transistor and a sink transistor between the first power supply terminal and the second power supply terminal, wherein a first current electrode of the source follower transistor is coupled to the current source, and a second current electrode of the source follower transistor is coupled to the virtual ground node.

2. The non-volatile memory of claim 1, wherein each memory cell of the memory array is coupled to a second column line of a plurality of second column lines, the non-volatile memory further comprising:
    a second column line multiplexer (MUX) configured to couple each selected second column line of the set of second column lines to the write circuitry during the memory write operation, and configured to couple each unselected second column line of the plurality of second column lines to the virtual ground node during the memory write operation.

3. The non-volatile memory of claim 2, wherein the plurality of first column lines are characterized as one of source lines or bit lines, and the plurality of second column lines are characterized as another one of the source lines or bit lines.

4. The non-volatile memory of claim 2, wherein the write circuitry comprises:
    a first set of drivers configured to couple each selected first column line of the set of first column lines to one of the first power supply or the second power supply terminal based on the write value; and
    a second set of drivers configured to couple each selected second column line of the set of second column lines to one of the first power supply terminal or the second power supply terminal based on the write value.

5. The non-volatile memory of claim 1, wherein a first current electrode of the sink transistor is coupled to the virtual ground node, a second current electrode of the sink transistor is coupled to the second power supply terminal, and a control electrode of the sink transistor is coupled to the first current electrode of the source follower transistor.

6. The non-volatile memory of claim 5, wherein the virtual ground circuitry further comprises:
    an operational amplifier having an output configured to provide a replica virtual ground voltage;
    a transistor having a first current electrode, a control electrode, and a second current electrode, wherein the second current electrode of the transistor is coupled to the output of the operational amplifier, and the first current electrode of the transistor is coupled to the gate electrode of the transistor and to the gate electrode of the source follower transistor; and
    a second current source coupled between the first power supply terminal and the first current electrode of the transistor.

7. The non-volatile memory of claim 1, wherein the storage element in each memory cell of the memory array is characterized as a resistive storage element.

8. The non-volatile memory of claim 1, wherein the write circuitry comprises a first set of drivers configured to couple each selected first column line of the set of first column lines to one of the first power supply or the second power supply terminal based on the write value.

9. A non-volatile memory comprising:
    virtual ground circuitry coupled to a first power supply terminal and a second power supply terminal and configured to generate a virtual ground voltage at a virtual ground node, wherein the first power supply terminal is configured to provide a first power supply voltage and the second power supply terminal is configured to provide a second power supply voltage which is less than the first power supply voltage, wherein the virtual ground voltage is greater than zero volts and is between the first power supply voltage and the second power supply voltage;
    a memory array of memory cells, each memory cell of the memory array including a select transistor and a storage element for storing a value, wherein each memory cell is coupled to a first column line of a plurality of first column lines;
    a first decoder configured to select a set of first column lines from the plurality of first column lines for a memory write operation to a selected set of the memory cells coupled to the selected set of first column lines;
    write circuitry configured to receive a write value for storage into the selected set of memory cells during the memory write operation; and
    a first column line multiplexer (MUX) configured to couple each selected first column line of the set of first column lines to the write circuitry during the memory write operation, and configured to couple each unselected first column line of the plurality of first column lines to the virtual ground node during the memory write operation,
    wherein the virtual ground circuitry comprises:
        a current compensator coupled to the virtual ground node via a first enable switch, wherein the first enable switch is configured to be conductive to couple the current compensator to the virtual ground node during a memory read operation.

10. The memory of claim 9, wherein the current compensator comprises a compensator current source coupled between the first enable switch and the second power supply terminal.

11. The non-volatile memory of claim 9, wherein the virtual ground circuitry comprises a source follower amplifier, in which a transistor of the source follower amplifier has a first current electrode coupled to the first power supply terminal, a control electrode coupled to an output of an amplifier of the source follower amplifier, and a second current electrode coupled to the virtual ground node.

12. The non-volatile memory of claim 9, wherein each memory cell of the memory array is coupled to a second column line of a plurality of second column lines, the non-volatile memory further comprising:
a second column line multiplexer (MUX) configured to couple each selected second column line of the set of second column lines to the write circuitry during the memory write operation, and configured to couple each unselected second column line of the plurality of second column lines to the virtual ground node during the memory write operation.

13. The non-volatile memory of claim 12, wherein the plurality of first column lines are characterized as one of source lines or bit lines, and the plurality of second column lines are characterized as another one of the source lines or bit lines.

14. The non-volatile memory of claim 9, wherein the storage element in each memory cell of the memory array is characterized as a resistive storage element.

15. The non-volatile memory of claim 9, wherein the write circuitry comprises a first set of drivers configured to couple each selected first column line of the set of first column lines to one of the first power supply or the second power supply terminal based on the write value.

16. The non-volatile memory of claim 15, wherein the write circuitry comprises:
a first set of drivers configured to couple each selected first column line of the set of first column lines to one of the first power supply or the second power supply terminal based on the write value; and
a second set of drivers configured to couple each selected second column line of the set of second column lines to one of the first power supply terminal or the second power supply terminal based on the write value.

17. A non-volatile memory comprising:
virtual ground circuitry coupled to a first power supply terminal and a second power supply terminal and configured to generate a virtual ground voltage at a virtual ground node, wherein the first power supply terminal is configured to provide a first power supply voltage and the second power supply terminal is configured to provide a second power supply voltage which is less than the first power supply voltage, wherein the virtual ground voltage is at least 100 mV greater than the second power supply voltage and less than the first power supply voltage;
a memory array of memory cells, each memory cell of the memory array including a select transistor and a storage element for storing a value, wherein each memory cell is coupled to a source line of a plurality of source lines and to a bit line of a plurality of bit lines;
a decoder configured to select a set of source lines from the plurality of source lines and a set of bit lines from the plurality of bit lines for a memory write operation to a selected set of the memory cells coupled to the selected set of source lines and the selected set of bit lines;
write circuitry configured to receive a write value for storage into the selected set of memory cells during the memory write operation;
a source line multiplexer (MUX) configured to couple each selected source line of the set of source lines to the write circuitry during the memory write operation, and configured to couple each unselected source line of the plurality of source lines to the virtual ground node during the memory write operation; and
a bit line MUX configured to couple each selected bit line of the set of bit lines to the write circuitry during the memory operation, and configured to couple each unselected bit line of the plurality of bit lines to the virtual ground node during the memory write operation,
wherein the virtual ground circuitry comprises:
a flipped voltage follower circuit having a current source coupled in series with a source follower transistor and a sink transistor between the first power supply terminal and the second power supply terminal, wherein a first current electrode of the source follower transistor is coupled to the current source, and a second current electrode of the source follower transistor is coupled to the virtual ground node.

18. The non-volatile memory of claim 17, wherein the second power supply voltage is true ground.

19. The non-volatile memory of claim 17, wherein the write circuitry comprises:
a set of drivers, each driver configured to receive a corresponding bit of the write value, a corresponding source line of the selected set of source lines, and a corresponding bit line of the selected set of bit lines and configured to, during the memory write operation, couple the corresponding source line to one of the first power supply or the second power supply terminal and the corresponding bit line to another one of the first power supply or the second power supply based on the corresponding bit of the write value.

20. In a memory having a first power supply terminal configured to provide a first supply voltage, a second power supply terminal configured to provide a second supply voltage less than the first supply voltage, and a memory array of memory cells in which each memory cell is coupled to a first column line of a plurality of first column lines, a method comprising:
selecting a set of first column lines from the plurality of first column lines for a memory write operation of a write value to a selected set of the memory cells coupled to the selected set of first column lines;
generating a virtual ground voltage at a virtual ground node, wherein the virtual ground voltage is greater than the second supply voltage, and less than the first power supply voltage, wherein in a flipped voltage follower circuit having a current source coupled in series with a source follower transistor and a sink transistor between the first power supply terminal and the second power supply terminal, a first current electrode of the source follower transistor is coupled to the current source, and a second current electrode of the source follower transistor is coupled to the virtual ground node to generate the virtual ground voltage; and
during the memory write operation:
coupling all unselected first column lines of the plurality of first column lines to the virtual ground node;

coupling each first column line of the selected set of first column lines to write circuitry configured to receive the write value, in which each memory cell of the selected set of memory cells stores a corresponding unique bit of the write value; and providing a current through each memory cell of the selected set of memory cells based on the write value, wherein, for each memory cell, the current is provided through the memory cell in a first direction when the corresponding unique bit has first value, and in a second direction, opposite the first direction, when the corresponding unique bit has a second value, different from the first value.

21. The method of claim 20, wherein each resistive memory cell of the memory array is coupled to a second column line of a plurality of second column lines, the method further comprising:

coupling each second column line of a selected set of second column lines to the write circuitry during the memory write operation; and coupling all unselected second column lines of the plurality of second column lines to the virtual ground node during the memory write operation.

22. The method of claim 21, wherein the plurality of first column lines are characterized as one of source lines or bit lines, and the plurality of second column lines are characterized as another one of the source lines or bit lines.

23. The method of claim 21, wherein, during the memory write operation, for each memory cell, the write circuitry couples the first column line of the selected set of first column lines coupled to the memory cell to one of the first power supply terminal and the second power supply terminal and couples the second column line of the selected set of second column lines coupled to the memory cell to another of the first power supply terminal and the second power supply terminal, based on a value of the corresponding unique bit.

* * * * *